United States Patent
Smela et al.

(10) Patent No.: US 7,139,207 B2
(45) Date of Patent: Nov. 21, 2006

(54) MEMORY INTERFACE METHODS AND APPARATUS

(75) Inventors: Jonathan Q. Smela, Loveland, CO (US); Michael K. Tayler, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 149 days.

(21) Appl. No.: 11/066,087

(22) Filed: Feb. 25, 2005

(65) Prior Publication Data

US 2006/0193188 A1    Aug. 31, 2006

(51) Int. Cl.
*G11C 7/00*    (2006.01)

(52) U.S. Cl. ........................ 365/221; 365/193
(58) Field of Classification Search ........... 365/221, 365/193
See application file for complete search history.

(56) References Cited

U.S. PATENT DOCUMENTS

| | | | | |
|---|---|---|---|---|
| 6,034,916 A | * | 3/2000 | Lee | 365/233 |
| 6,135,354 A | * | 10/2000 | Kubon | 235/462.11 |
| 6,286,077 B1 | * | 9/2001 | Choi et al. | 711/105 |
| 6,376,869 B1 | * | 4/2002 | Tomita | 257/288 |
| 2005/0005054 A1 | * | 1/2005 | Jang | 711/1 |

* cited by examiner

*Primary Examiner*—M. Tran

(57) ABSTRACT

Memory interface methods and apparatus for processing source synchronous data from a memory device (DRAM). The methods and apparatus synchronously transfer data from the memory device to a memory controller even though the time variability of read return strobe signals is greater than one clock cycle.

8 Claims, 5 Drawing Sheets

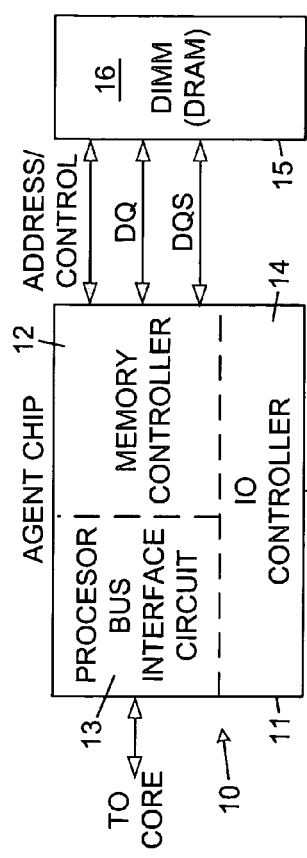
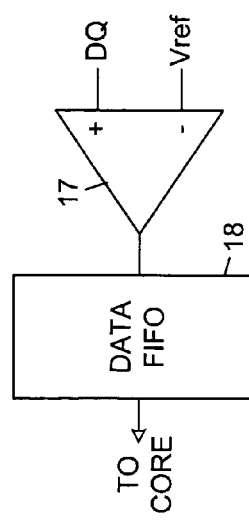
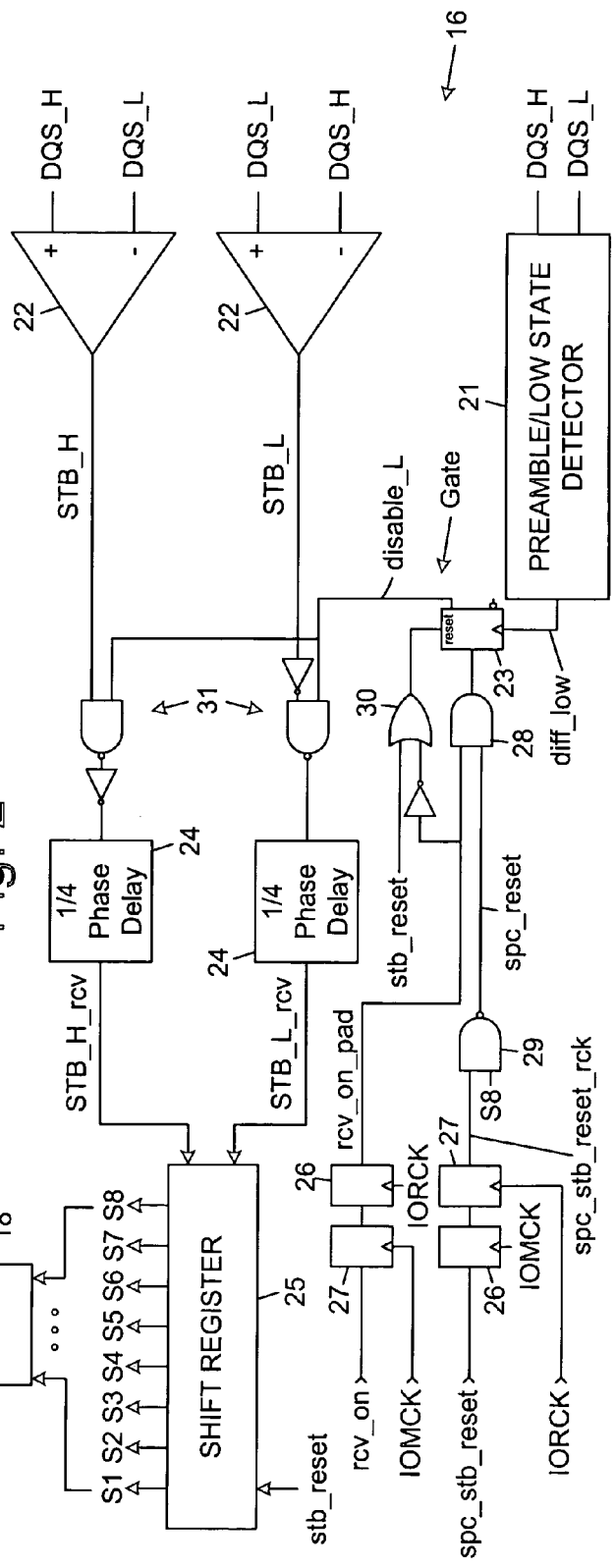
Fig. 1
Fig. 2

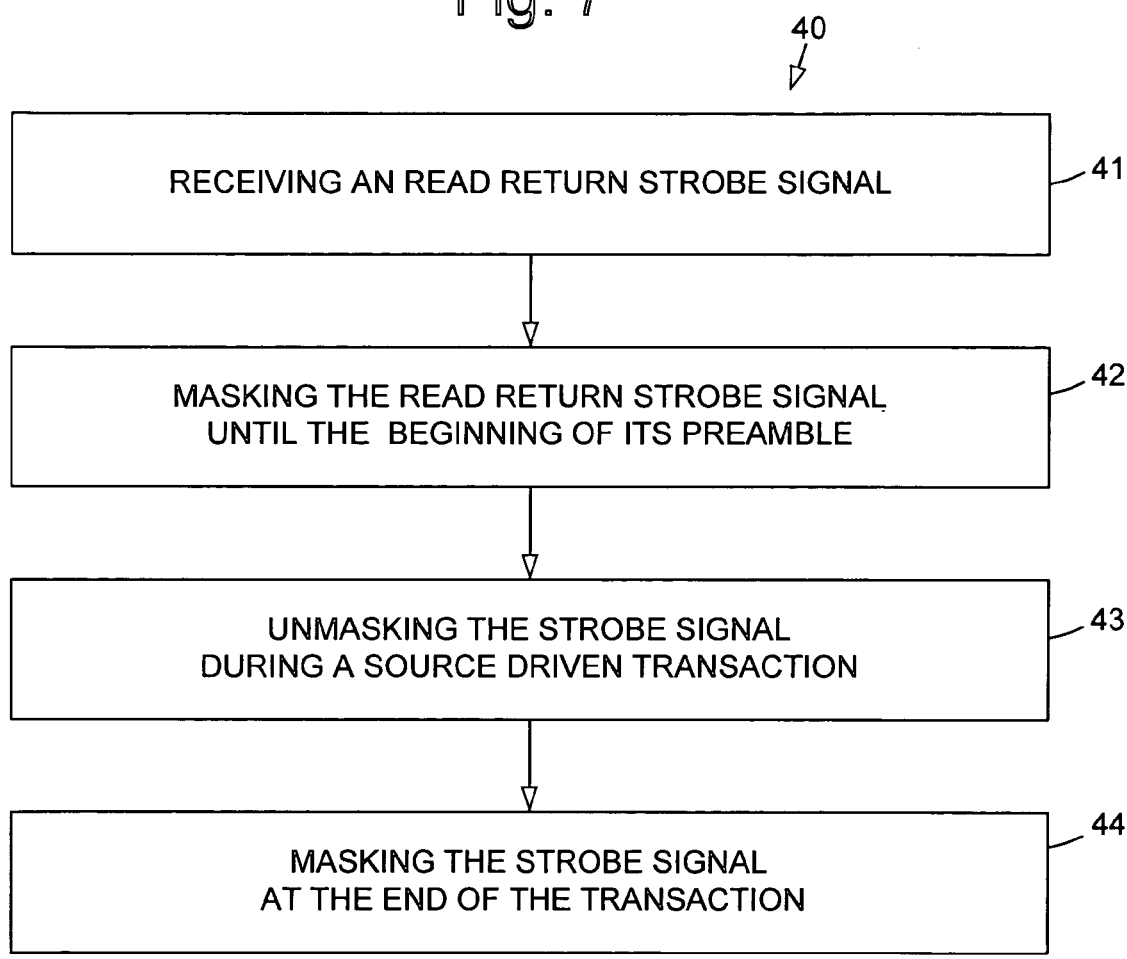

MEMORY INTERFACE METHODS AND APPARATUS

TECHNICAL FIELD

The present invention relates generally to memory interface methods and apparatus.

BACKGROUND

Handling of source synchronous data from a memory device, such as a DRAM, is an important design challenge for a memory interface. The challenge stems from the time variability of a returning strobe signal because of factors such as process, voltage, temperature (PVT), board trace variation and clock uncertainties to name a few. Due to these factors, there can be significant variability between the earliest and latest possible times at which strobe signals start transitioning at an agent interface (i.e., interface between a control chip or controller and the DRAM).

The Double Data Rate (DDR2) protocol stipulates that strobe signals driven by the DRAM have a preamble of one clock cycle. This preamble is defined as the time period preceding the first strobe signal edge when DQS_H (active high strobe signal) is low and DQS_L (active low strobe signal) is high.

In previous memory subsystems developed by the assignee of the present invention (such as for a zx1 chipset), the time variability for the returning strobe signals is less than one clock cycle. This small variability allows a memory controller to generate a core synchronous signal that is guaranteed to be within the preamble of both the earliest and latest possible strobe signals. This core synchronous signal enables internal circuitry of a read data state machine (internal to the core) to begin responding to the input strobe. The result is a core synchronous control scheme that guarantees a deterministic state of the read data state machine.

Through analysis of the memory subsystem in a zx2 chipset developed by the assignee of the present invention, it has been determined that the time variability of read return strobe signals is greater than one clock cycle and that the previously-developed methodology could not be used.

BRIEF DESCRIPTION OF THE DRAWINGS

The various features and advantages of embodiments of the present invention may be more readily understood with reference to the following detailed description taken in conjunction with the accompanying drawings, wherein like reference numerals designate like structural elements, and in which:

FIG. 1 is a block diagram showing a portion of an exemplary embodiment of a computer system incorporating the present invention;

FIG. 2 illustrates an exemplary embodiment of strobe gating apparatus in accordance with the principles of the present invention;

FIG. 7 is a flow diagram that illustrates an exemplary embodiment of a method in accordance with the principles of the present invention.

DETAILED DESCRIPTION

Figure 3:
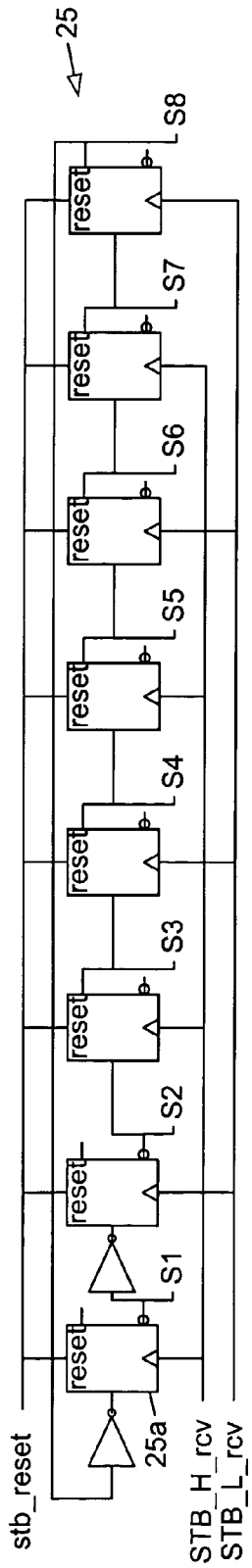
FIG. 3 illustrates an exemplary embodiment of a shift register employed in the apparatus shown in FIG. 1.

Referring to the drawing figures, FIG. 1 is a block diagram showing a portion of an exemplary embodiment of a computer system 10 incorporating the present invention. The exemplary system 10 includes an agent integrated circuit chip 11 that comprises a memory controller 12, a bus interface circuit 13 and an IO controller 14. The memory controller 12 is coupled to a memory device 15, such as a dual inline memory module (DIMM) 15 comprising DRAM chips 15. Address/control lines, data signal (DQ) lines and strobe signal (DQS) lines of a memory bus couple the memory controller 12 to the memory device 15.

FIG. 2 illustrates an exemplary embodiment of strobe gating apparatus 16 (or strobe gating logic 16) in accordance with the principles of the present invention. More particularly, FIG. 2 shows exemplary strobe gating logic 16 located in pads of an agent chip which communicates to the DDR2 memory device 15. The strobe gating logic 16 communicates with the "outside world" (i.e., DIMM 15) and to the "inside world" (i.e., the memory controller 12 inside the agent chip 11).

As is illustrated in FIG. 2, the strobe gating apparatus 16 comprises a data receiver 17 that receives a voltage reference signal (Vref) and data signals (DQ) output by the memory device 15. The output of the data receiver 17 is coupled to a data first-in, first-out (FIFO) circuit 18 (data FIFO 18). The output of the data FIFO 18 is coupled by way of the memory controller 12 and bus interface circuit 13 to an internal logic core that comprises a read data state machine. Read return strobe signals (DQS), comprising high and low strobe signals (DQS_H, DQS_L), are input to the strobe gating apparatus 16 by way a differential strobe receiver 22. The strobe receiver 22 outputs a complimentary strobe signal pair (STB_H, STB_L) that are processed to produce a gate that is synchronous to each individual strobe signal. The read return strobe signals (DQS) are also input to a preamble detector 21.

The strobe gating apparatus 16 addresses the problem in DDR2 memory devices 15 wherein the time variability of read return strobe signals (DQS) output by the memory device 15 is greater than one clock cycle. The strobe gating apparatus 16 provides for core synchronous control that guarantees a deterministic state of the read data state machine.

In particular, the strobe gating apparatus 16 handles the time variability of the read return strobe signals (DQS). In general, the strobe gate apparatus 16 generates masking signals that masks input strobe signals (DQS) until the beginning of preambles of the strobe signals, unmasks the strobe signals during a source driven transaction from the memory device 15, and masks the strobe signals at the end of the transaction. The result is a gate that is synchronous to each individual strobe signal which provides for a memory interface or subsystem (memory controller 12, memory bus, DRAM 15) that can tolerate as much a one and one half clock cycles of time variation.

In order to provide accurate control of the strobe gate, a variable phase read clock, IORCK, is used to register core control signals. The read clock can have a 0, 90, 180 or 270 degree phase shift relative to a memory controller clock in the core. The variable phase clock allows quarter clock cycle resolution on core-to-pad control signal timing without requiring a clock whose frequency is 4 times the core memory controller clock.

Figure 5:
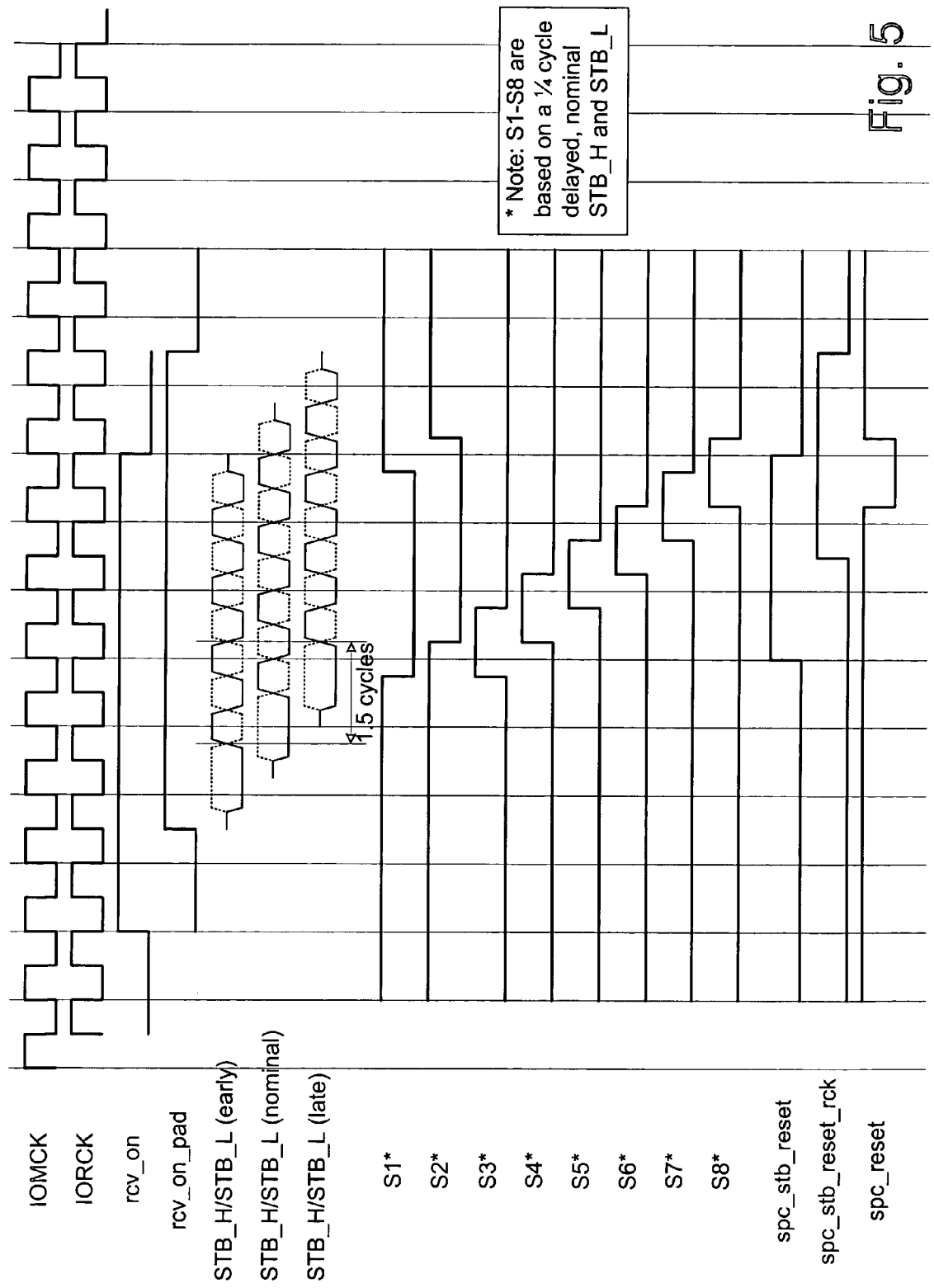
FIG. 5 illustrates ¼ cycle resolution and shift register timing diagram for the apparatus shown in FIG. 1.

IOMCK represents a clock with a 0 phase relationship to a core memory controller clock. Each timing critical signal from the core is captured by a flip-flop 26 that is clocked by IOMCK. However, since the nominal returning strobe signal may not be aligned to the core clock, a flip-flop 27 controlled by the variable phase read clock, IORCK, is employed. The flip-flops 26, 27 output a core driven signal (rcv_on_pad or spc_stb_reset_rck) with a quarter clock cycle resolution to the nominal strobe edge. FIG. 5, the timing relationship for rcv_on_pad and spc_stb_reset_rck is illustrated for a read clock that is 180 degrees out of phase to IOMCK. The appropriate core driven signal is selectively gated using an AND gate 28 and NAND gate 29 Referring to a gate flip-flop 23 or gate control register 23.

The strobe gating apparatus 16 synchronizes the phase-shifted, core control signals to the local strobe signal to accurately control a gate (represented by the output of a gate flip-flop 23 or gate control register 23). To accomplish local alignment, the output of the preamble detector 21 is used as a low state detector 21. The low state detector 21 clocks the gate flip-flop 23, which can be asynchronously reset. The importance of the asynchronous reset is to guarantee a known output state of the gate flip-flop 23 during reset.

Resetting of the gate flip-flop 23 is controlled by an OR function of stb_reset and an inversion of rcv_on_pad (using an OR gate 30). The result is that the OR gate 30 is closed whenever reset is asserted and invalid strobe signals are masked. Also, stb_reset (based on a core reset signal) drives a shift register 25 into a known state and de-asserts rcv_on (logically low). Once the reset is no longer asserted, the rcv_on_pad signal will act as an active control for opening and closing of the gate.

After the memory controller 12 issues a read transaction to the DRAM 15, a counter internal to the core waits a fixed number of clock cycles based on memory (DIMM) and system latency. The core then asserts rcv_on, which is clocked through the IOMCK and IORCK registers (flip-flops) 26, 27 to assert rcv_on_pad. rcv_on_pad is then presented at the input of the gate control register 23 (gate flip-flop 23) whose clock is provided by the low state detector 21 to locally open the gate.

Figure 6:
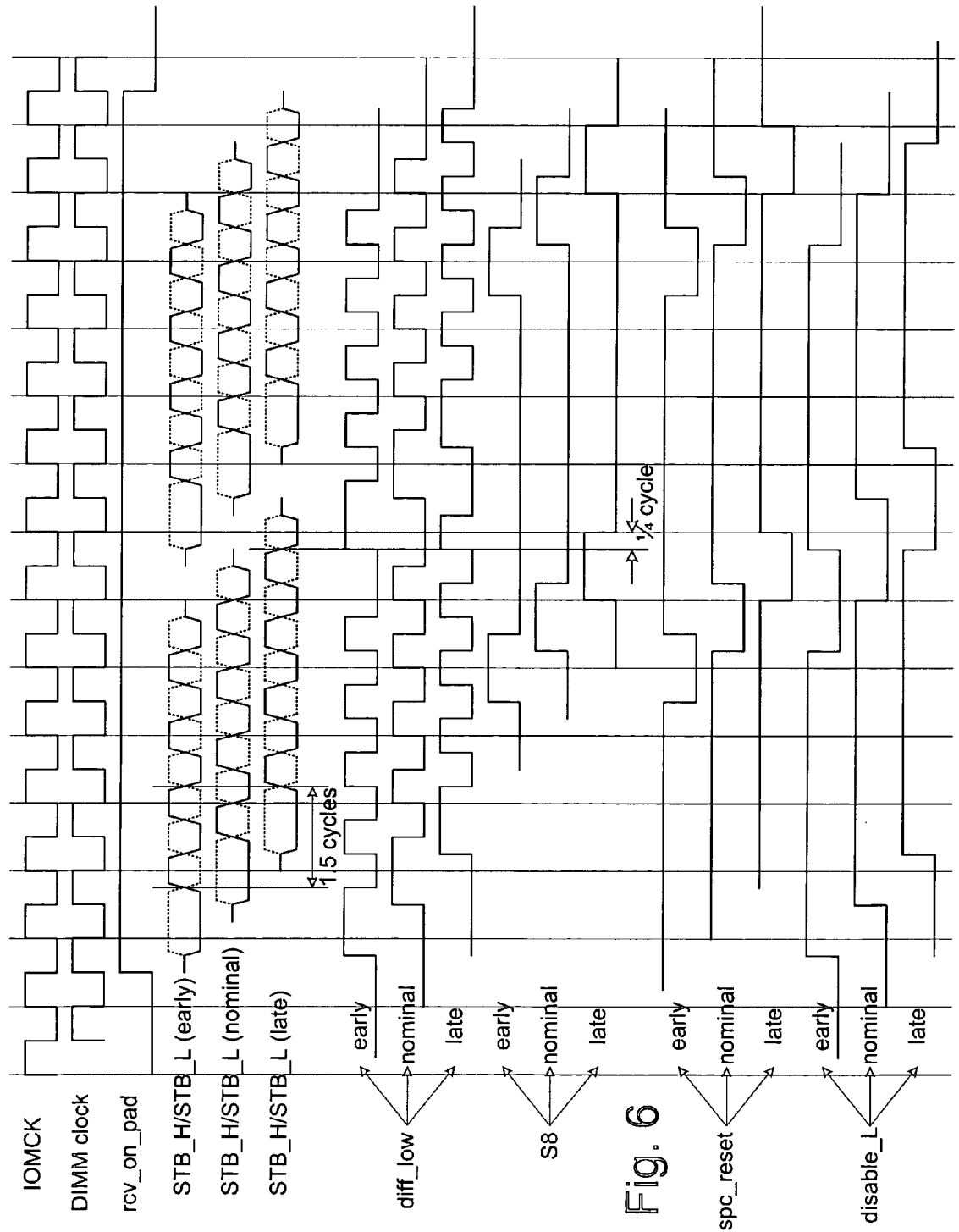
FIG. 6 illustrates an exemplary strobe variation timing diagram for the apparatus shown in FIG. 1.

Referring to FIG. 6, it illustrates an exemplary strobe variation timing diagram for the apparatus 16 shown in FIG. 2. In FIG. 6, diff_low is the output of the low state detector 21. This waveform is shown for early, nominal and late returning strobe signals which are separated by a 1.5 clock cycle variance. Each diff_low signal is synchronous to its associated strobe signal and the rising edges will clock in the input of the gate flip-flop 23 (gate control register 23) it controls when the reset is not asserted. As is shown in FIG. 6, the first rising edge of diff_low causes the gate to be opened (i.e. disable_L rises). The strobe signal input to the strobe receiver 22 is then controlled using inverting NAND gate logic 31 to pass through a ¼ clock cycle delay 24 to the shift register 25.

Figure 4:
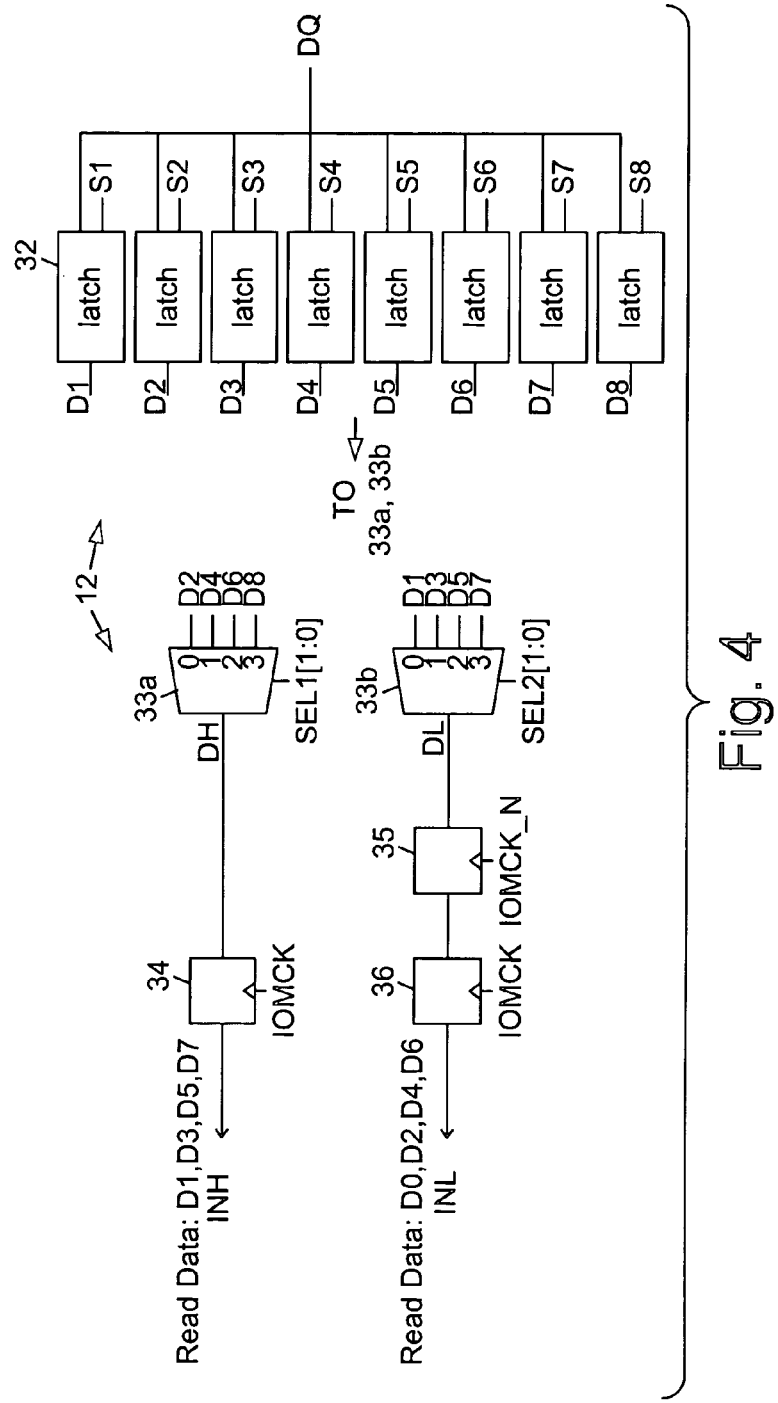
FIG. 4 illustrates an exemplary embodiment of a data FIFO employed in the apparatus shown in FIG. 1.

The shift register 25, shown in detail in FIG. 3, holds the read transaction state information and clocks the data into the data FIFO 18, shown in detail in FIG. 4. Referring to FIG. 3, the shift register 25 is comprised of eight flip-flops 25a with asynchronous resets and both inverting and non-inverting outputs. STB_H is connected to the clock input of every other flip-flop 31 beginning with the first, and STB_L is connected to the clock input of every other flip-flop 25a beginning with the second. The flip-flops 25a of the shift register 25 are connected in such a way that the shift register 25 is reset to the initial state or returns there after a burst length of eight pieces of data. The initial state, shown in FIG. 5, is where S1 and S2 are high and S3 to S8 are low.

Referring to FIG. 4, the data FIFO 18 is comprised of eight level-sensitive latches 32 followed by two multiplexers 33a, 33b. Appropriate registers 34, 35, 36 follow the multiplexers 33a, 33b. The first STB_H rising edge causes S1 to fall, latching data into the first entry of the data FIFO 18. This edge also propagates S2 through the flip-flop 25a in the shift register 25 and S3 rises. As a result, two entries of the data FIFO 18 are always open but only one gets latched on a given edge of the strobe signal input.

Referring again to FIG. 2, at the end of a write transaction, the strobe gating apparatus 16 protects the internal state of the shift register 25 by closing the gate before the DRAM source (DRAM 14) stops driving. Referring to FIG. 2, spc_stb_reset is aligned to the proper ¼ clock cycle boundary by the read clock, IORCK. The resulting signal, spc_stb_reset_rck, is NANDed 29 with the state of the shift register 25 to create spc_reset. The state signal used is S8 which signifies that there is ¼ of a clock cycle until the postamble of the input strobe signal. Since the shift register 25 is based on a ¼ clock cycle delayed version of the input strobe and the spc_reset is acting on the non-delayed strobe signal, the timing budget is 1¼ clock cycles. The purpose of the spc_reset is to signal when the memory controller 12 expects the end of a read transaction and the shift register 25 indicates that it is in its last state.

FIGS. 5 and 6 show the resulting low pulse that is sent to the input of the gate flip-flop 23 or control register 23 controlling the gate. Because of the incorporation of the state signal S8 in the generation of spc_reset, the spc_reset pulse is clocked into the gate control register 23 by the last rising edge from the low state detector 21 and the gate is closed.

The strobe gating apparatus 16 also addresses various spacings of read transactions. Read transactions that are spaced by the minimum spacing of four clock cycles will have 16 continuous, periodic strobe signals. Also, read transactions that are spaced by five clock cycles are in effect abutted. Each transaction has a preamble, 8 strobe transitions, and a half clock cycle postamble. Thus, for read transactions spaced 5 clock cycles apart, the postamble of the first transaction is complete at the same time the preamble of the second transaction starts. Lastly, transactions spaced by six or more clock cycles have one clock cycle or more during which the strobe signals are not driven.

To handle various combinations of transaction spacing, the memory controller 12 monitors the distance between transactions. For read transactions spaced by four or five clock cycles, the core spc_stb_reset signal is not asserted at the end of the first read transaction and the gate remains open for the entirety of both transactions. But for those read transactions spaced by six clock cycles or more, the memory controller 12 drives spc_stb_reset to the pad to ensure that the gate is closed during the postamble of the first transaction and remains closed until the preamble of the second transaction.

FIG. 6 illustrates the strobe signals and associated gating signals for a six clock cycle spacing of two read transactions. The gate (disable_L) is opened at the start of the preamble and closed with the last strobe edge of the first transaction. The gate is then reopened at the start of the preamble of the second transaction and closed with the last strobe edge. As a result the correct data is written to the data FIFO 18 and on to the memory controller core, the state of the shift register 25 is intact, the entire gating operation was synchronous to the local strobe signal, and a variance of up to 1¼ clock cycles from earliest to latest possible strobe signal is supported.

Advantages of the strobe gating apparatus 16 include the ability to open early and close late the read return window for a DDR2 protocol, source synchronous bus. Additionally, this design ensures the state of the internal machine is not affected by invalid strobe transitions and therefore is deterministic. On a larger scale, the flexibilities created by increasing the read window provide greater design freedom for system designers.

For the purposes of completeness, FIG. 7 is a flow diagram that illustrates an exemplary embodiment of a method 40 in accordance with the principles of the present invention. The exemplary method 40 handles source synchronous data from a memory device 15 to achieve core synchronous control, and is implemented as follows.

An input strobe signal is received 41 from the memory device 15. The input strobe signal is masked 42 until the beginning of a preamble of the strobe signal. The strobe signal is unmasked 43 during a source driven transaction from the memory device 15. The strobe signal is masked 44 at the end of the transaction.

Thus, exemplary embodiments of memory interface methods and apparatus have been disclosed for handling source synchronous data from a memory device (DRAM). Data is synchronously transferred from the memory device to an agent chip comprising a read data state machine even though the time variability of read return strobe signals is greater than one clock cycle. A differential strobe signal pair is gated with a core synchronous control signal to guarantee a deterministic state of the read data state machine. DDR2-SDRAM-type random access memory interfaces or subsystems may advantageously use the methods and apparatus.

The present solution removes the requirement to have the strobe signal read window variation within the width of one preamble (one clock cycle) and provides signal integrity to the agent chip's internal logic core (i.e., memory controller core logic). Hence, the memory interface or subsystem can successfully and accurately provide an interface to the DDR2 memory.

Thus, memory interface methods and apparatus have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. Strobe gating apparatus for use with a memory device that outputs read return strobe signals, comprising:
    gating logic for processing the read return strobe signals to mask the strobe signals until the beginning of its preamble, unmask the strobe signals during a transaction driven by the memory device, and mask the strobe signals at the end of the transaction.

2. The apparatus recited in claim 1 wherein the preamble is a time period preceding a first strobe signal edge when an active high strobe signal is low and an active low strobe signal is high.

3. The apparatus recited in claim 1 wherein the gating logic comprises:
    a data receiver for receiving a data signal from the memory device;
    a data first-in, first-out (FIFO) circuit that interfaces the data receiver to a memory controller;
    a strobe receiver for receiving the input strobe signal and outputting a differential strobe signal pair;
    a preamble detector for processing the input strobe signal to generate a gating clock signal;
    a shift register for clocking the data signal into the data FIFO circuit; and
    gating logic responsive to the differential strobe signal pair, the gating clock signal, and control signals derived from the memory controller, for generating masking signals that mask the input strobe signal until the beginning of the preamble, unmask the strobe signal during the source driven transaction, and mask the strobe signal at the end of the transaction.

4. Apparatus for use with an agent chip's memory controller and a memory device that outputs read return strobe signals that control transfer of data from the memory device to the memory controller, and wherein time intervals between successive read return strobe signals can be greater than one clock cycle, the apparatus comprising:
    gating means for processing the read return strobe signals to mask each read return strobe signal until the beginning of its preamble, unmask each strobe signal during a transaction driven by the memory device, and mask each strobe signal at the end of the transaction.

5. The apparatus recited in claim 4 wherein the preamble is a time period preceding a first strobe signal edge when an active high strobe signal is low and an active low strobe signal is high.

6. The apparatus recited in claim 4 wherein the gating means comprises:
    data receiver means for receiving a data signal from the memory device;
    data first-in, first-out (FIFO) means for interfacing the data receiver to a memory controller;
    strobe receiver means for receiving the input strobe signal and outputting a differential strobe signal pair;
    preamble detector for means or processing the input strobe signal to generate a gating clock signal; and
    shift register means for clocking the data signal into the data FIFO circuit; and
    wherein the gating logic is responsive to the differential strobe signal pair, the gating clock signal, and control signals derived from the memory controller, for generating masking signals that mask the input strobe signal until the beginning of the preamble, unmask the strobe signal during the source driven transaction, and mask the strobe signal at the end of the transaction.

7. A method of processing source synchronous data from a memory device that outputs read return strobe signals, and wherein time intervals between successive read return strobe signals can be greater than one clock cycle, comprising:
    receiving an read return strobe signal;
    masking the read return strobe signal until the beginning of its preamble;
    unmasking the read return strobe signal during a source driven transaction from the memory device; and
    masking the strobe signal at the end of the transaction.

8. The method recited in claim 7 wherein the preamble is a time period preceding a first strobe signal edge when an active high strobe signal is low and an active low strobe signal is high.

* * * * *